United States Patent
Shahrokhi et al.

(10) Patent No.: US 9,958,488 B2
(45) Date of Patent: *May 1, 2018

(54) CAPACITANCE MEASUREMENT

(71) Applicant: Synaptics Incorporated, San Jose, CA (US)

(72) Inventors: Farzaneh Shahrokhi, San Jose, CA (US); Tracy Scott Dattalo, Santa Clara, CA (US); Joseph Kurth Reynolds, Alviso, CA (US); Adam Schwartz, Redwood City, CA (US)

(73) Assignee: Synaptics Incorporated, San Jose, CA (US)

( * ) Notice: Subject to any disclaimer, the term of this patent is extended or adjusted under 35 U.S.C. 154(b) by 332 days.

This patent is subject to a terminal disclaimer.

(21) Appl. No.: 14/802,720

(22) Filed: Jul. 17, 2015

(65) Prior Publication Data
US 2015/0323578 A1    Nov. 12, 2015

Related U.S. Application Data

(63) Continuation of application No. 13/843,129, filed on Mar. 15, 2013, now Pat. No. 9,182,432.
(Continued)

(51) Int. Cl.
*G01R 27/26* (2006.01)
*G01D 5/24* (2006.01)
(Continued)

(52) U.S. Cl.
CPC .......... *G01R 27/2605* (2013.01); *G01D 5/24* (2013.01); *G06F 3/044* (2013.01); *G06F 3/0416* (2013.01)

(58) Field of Classification Search
CPC ...... G01R 27/26; G01R 27/2605; G01D 5/24; G01D 3/08; G06F 3/041; G06F 3/0416;
(Continued)

(56) References Cited

U.S. PATENT DOCUMENTS 5,841,078 A    11/1998    Miller et al.
5,945,980 A    8/1999    Moissev et al.
(Continued)

FOREIGN PATENT DOCUMENTS

CN    101937662 A    1/2011
JP    2008-026249 A    2/2008
(Continued)

OTHER PUBLICATIONS

Office Action for Application No. 2015-523147, dated Sep. 13, 2016, 4 pages.
(Continued)

*Primary Examiner* — Son Le
(74) *Attorney, Agent, or Firm* — FBFK PC

(57) ABSTRACT

A capacitance measurement circuit comprises a differential amplifier with first and second inputs and an output, first and second feedback capacitances, and a reset mechanism. The first input is coupled to a modulated reference voltage and the second input is coupled with a sensor electrode. A first feedback capacitance is coupled between the output and the second input. A second feedback capacitance is coupled between the output and the second input. The reset mechanism resets the first feedback capacitance to a first level of charge and the second feedback capacitance to a second level of charge. During an absolute capacitance measurement phase, the differential amplifier charges the sensor electrode while balancing voltages on the first and second inputs to a voltage level associated with the modulated reference voltage and integrates charge on the sensor electrode to measure capacitance corresponding to a coupling between the sensor electrode and an input object.

18 Claims, 12 Drawing Sheets

Related U.S. Application Data

(60) Provisional application No. 61/693,541, filed on Aug. 27, 2012, provisional application No. 61/673,241, filed on Jul. 18, 2012.

(51) Int. Cl.
*G06F 3/044* (2006.01)
*G06F 3/041* (2006.01)

(58) Field of Classification Search
CPC ........ G06F 3/044; H03K 2217/960765; H03K 17/955
See application file for complete search history.

(56) References Cited

U.S. PATENT DOCUMENTS

| | | | |
|---|---|---|---|
| 7,863,909 B2 | 1/2011 | Keith | |
| 7,902,842 B2 | 3/2011 | Reynolds et al. | |
| 7,986,313 B2 | 7/2011 | Krah | |
| 8,354,847 B2 | 1/2013 | Robinson | |
| 2005/0156881 A1 | 7/2005 | Trent, Jr. et al. | |
| 2006/0244733 A1 | 11/2006 | Geaghan | |
| 2006/0273804 A1* | 12/2006 | Delorme | G01D 5/24 324/658 |
| 2007/0074914 A1 | 4/2007 | Geaghan et al. | |
| 2007/0247443 A1 | 10/2007 | Philipp | |
| 2008/0048997 A1 | 2/2008 | Gillespie et al. | |
| 2008/0116904 A1 | 5/2008 | Reynolds et al. | |
| 2008/0157782 A1 | 7/2008 | Krah | |
| 2008/0158172 A1 | 7/2008 | Hotelling et al. | |
| 2008/0158183 A1 | 7/2008 | Hotelling et al. | |
| 2008/0162996 A1 | 7/2008 | Krah et al. | |
| 2008/0162997 A1 | 7/2008 | Vu et al. | |
| 2008/0309631 A1 | 12/2008 | Westerman et al. | |
| 2009/0045816 A1* | 2/2009 | Robinson | G01R 29/24 324/457 |
| 2009/0160787 A1 | 6/2009 | Westerman et al. | |
| 2009/0224776 A1 | 9/2009 | Keith | |
| 2009/0284495 A1 | 11/2009 | Geaghan et al. | |
| 2010/0001973 A1 | 1/2010 | Hotelling et al. | |
| 2010/0060608 A1 | 3/2010 | Yousefpor | |
| 2010/0073301 A1 | 3/2010 | Yousefpor et al. | |
| 2010/0110040 A1* | 5/2010 | Kim | G06F 3/0412 345/174 |
| 2010/0164889 A1 | 7/2010 | Hristov et al. | |
| 2010/0245286 A1 | 9/2010 | Parker | |
| 2010/0292945 A1 | 11/2010 | Reynolds et al. | |
| 2010/0327882 A1* | 12/2010 | Shahparnia | G01D 3/08 324/659 |
| 2011/0001492 A1 | 1/2011 | Nys et al. | |
| 2011/0006832 A1 | 1/2011 | Land et al. | |
| 2011/0007021 A1 | 1/2011 | Bernstein et al. | |
| 2011/0025629 A1 | 2/2011 | Grivna et al. | |
| 2012/0050211 A1 | 3/2012 | King et al. | |
| 2014/0021966 A1 | 1/2014 | Shahrokhi et al. | |

FOREIGN PATENT DOCUMENTS

| | | |
|---|---|---|
| JP | 2010-108501 A | 5/2010 |
| WO | 2012034714 A1 | 3/2012 |

OTHER PUBLICATIONS

Office Action Search Report for CN Application No. 201380047249.1, dated Mar. 21, 2016, 2 Pages.

ISA/KR, International Search Report and Written Opinion for International Application No. PCT/US2013/050386, 12 pages.

* cited by examiner

900

IN A CAPACITANCE MEASURING CIRCUIT COMPRISING A DIFFERENTIAL AMPLIFIER WITH DIFFERENTIAL FIRST AND SECOND INPUTS AND AN OUTPUT, OPENING A SWITCH DISPOSED BETWEEN A SENSOR ELECTRODE AND THE SECOND INPUT OF THE DIFFERENTIAL AMPLIFIER TO INITIATE A RESET PHASE WHERE THE SENSOR ELECTRODE AND THE DIFFERENTIAL AMPLIFIER ARE DECOUPLED
910

RESETTING A FEEDBACK CAPACITANCE TO A FIRST LEVEL OF CHARGE, THE FEEDBACK CAPACITANCE DISPOSED BETWEEN THE SECOND INPUT AND THE OUTPUT
920

CLOSING THE SWITCH TO INITIATE A MEASUREMENT PHASE WHERE THE SECOND INPUT AND THE SENSOR ELECTRODE ARE COUPLED
930

BALANCING CHARGE BETWEEN THE SENSOR ELECTRODE AND THE FEEDBACK CAPACITANCE SUCH THAT A SENSOR ELECTRODE VOLTAGE EQUALS A VOLTAGE OF THE FIRST INPUT EQUALS A VOLTAGE OF THE SECOND INPUT, AND THE SENSOR ELECTRODE IS CHARGED TO A VALUE PROPORTIONAL TO ITS CAPACITANCE AND THE VOLTAGE OF THE SECOND INPUT
932

UTILIZING THE DIFFERENTIAL AMPLIFIER TO INTEGRATE CHARGE ON THE SENSOR ELECTRODE, SUCH THAT AN ABSOLUTE CAPACITANCE IS MEASURED
934

FIG. 9A

CAPACITANCE MEASUREMENT

CROSS-REFERENCE TO RELATED U.S. PATENT APPLICATIONS

This application is a continuation application of and claims priority to and benefit of U.S. patent application Ser. No. 13/843,129 filed on Mar. 15, 2013 entitled "CAPACITANCE MEASUREMENT" by Farzaneh Shahrokhi et al., and assigned to the assignee of the present application.

Application Ser. No. 13/843,129 claims priority to and benefit of U.S. Provisional Patent Application No. 61/673,241 filed on Jul. 18, 2012 entitled "SYSTEM AND METHOD FOR SENSING ABSOLUTE CAPACITANCE" by Farzaneh Shahrokhi et al., and assigned to the assignee of the present application.

Application Ser. No. 13/843,129 also claims priority to and benefit of U.S. Provisional Patent Application No. 61/693,541 filed on Aug. 27, 2012 entitled "SYSTEM AND METHOD FOR SENSING ABSOLUTE CAPACITANCE" by Farzaneh Shahrokhi et al., and assigned to the assignee of the present application.

BACKGROUND

Input devices including proximity sensor devices (also commonly called touchpads or touch sensor devices) are widely used in a variety of electronic systems. A proximity sensor device typically includes a sensing region, often demarked by a surface, in which the proximity sensor device determines the presence, location and/or motion of one or more input objects. Proximity sensor devices may be used to provide interfaces for the electronic system. For example, proximity sensor devices are often used as input devices for larger computing systems (such as opaque touchpads integrated in, or peripheral to, notebook or desktop computers). Proximity sensor devices are also often used in smaller electronic devices/systems (such as touch screens integrated in cellular phones and tablet computers). Such touch screen input devices are typically superimposed upon or otherwise collocated with a display of the electronic device/system.

SUMMARY

In a method of capacitance measurement with a differential amplifier having an output and differential first and second inputs, a switch disposed between a sensor electrode and the second input of the differential amplifier is opened to initiate a reset phase where the sensor electrode and the differential amplifier are decoupled. A feedback capacitance disposed between the second input and the output is reset to a first level of charge. The switch is closed to initiate a measurement phase where the second input and the sensor electrode are coupled. In the measurement phase: charge is balanced between the sensor electrode and the feedback capacitance such that a sensor electrode voltage equals a voltage of the first input equals a voltage of the second input, and the sensor electrode is charged to a value proportional to its capacitance and the voltage of the second input; and the differential amplifier is utilized to integrate charge on the sensor electrode, such that an absolute capacitance is measured.

BRIEF DESCRIPTION OF DRAWINGS

The drawings referred to in this Brief Description of Drawings should not be understood as being drawn to scale unless specifically noted. The accompanying drawings, which are incorporated in and form a part of the Description of Embodiments, illustrate various embodiments and, together with the Description of Embodiments, serve to explain principles discussed below, where like designations denote like elements.

FIGS. 9A-9C illustrate a method of capacitance measurement with a differential amplifier having an output and differential first and second input, according to various embodiments.

DESCRIPTION OF EMBODIMENTS

The following Description of Embodiments is merely provided by way of example and not of limitation. Furthermore, there is no intention to be bound by any expressed or implied theory presented in the preceding Background, Summary, or Brief Description of Drawings or the following Description of Embodiments.

Overview of Discussion

Herein, various embodiments are described that provide input devices, processing systems, and methods that facilitate improved usability. In various embodiments described herein, the input device may be a capacitive input device.

Discussion begins with a comparison of transcapacitive sensing signals and modes with conventional absolute capacitance sensing signals and modes. In accordance with new embodiments described herein, an example capacitance measurement circuit is then presented and its operation described. A comparison of transcapacitive sensing signals and modes with signals and modes of new embodiments of absolute capacitive sensing is then presented and described. Several variations to the construction and operation of a new absolute capacitance measurement circuit are then presented and described. A hybrid transcapacitive/absolute capacitance measurement circuit is then presented and described. Operation of various new capacitive measurement circuits is then further described in conjunction with description of a method of capacitance measurement with a differential amplifier having an output and differential first and second input.

Example Input Device

Figure 1:
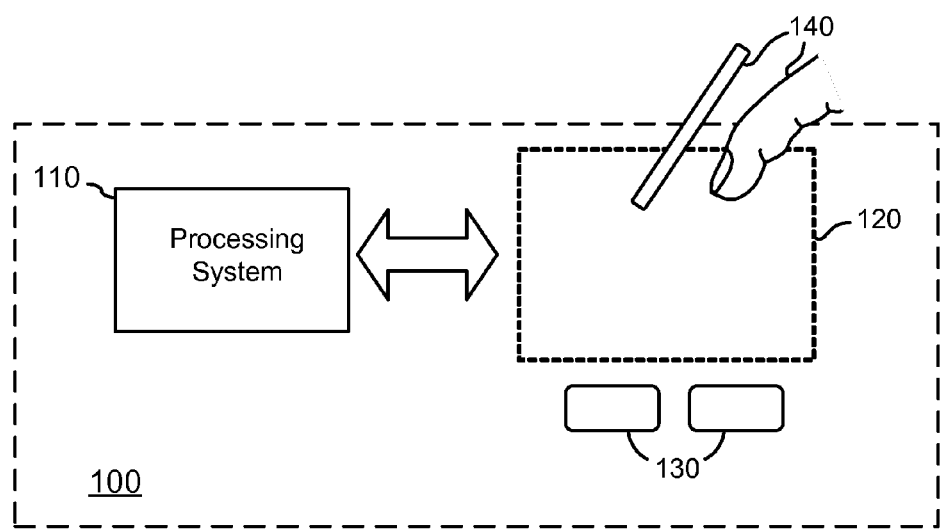
FIG. 1 is a block diagram of an example input device, in accordance with embodiments.

Turning now to the figures, FIG. 1 is a block diagram of an exemplary input device 100, in accordance with various embodiments. Input device 100 may be configured to provide input to an electronic system/device (not depicted). As used in this document, the term "electronic system" (or "electronic device") broadly refers to any system capable of electronically processing information. Some non-limiting examples of electronic systems include personal computers of all sizes and shapes, such as desktop computers, laptop computers, netbook computers, tablets, web browsers, e-book readers, and personal digital assistants (PDAs). Additional example electronic systems include composite input devices, such as physical keyboards that include input device 100 and separate joysticks or key switches. Further example electronic systems include peripherals such as data input devices (including remote controls and mice), and data output devices (including display screens and printers). Other examples include remote terminals, kiosks, and video game machines (e.g., video game consoles, portable gaming devices, and the like). Other examples include communication devices (including cellular phones, such as smart phones), and media devices (including recorders, editors, and players such as televisions, set-top boxes, music players, digital photo frames, and digital cameras). Additionally, the electronic systems could be a host or a slave to the input device.

Input device 100 can be implemented as a physical part of an electronic system, or can be physically separate from an electronic system. As appropriate, input device 100 may communicate with parts of the electronic system using any one or more of the following: buses, networks, and other wired or wireless interconnections. Examples include, but are not limited to: Inter-Integrated Circuit (I2C), Serial Peripheral Interface (SPI), Personal System 2 (PS/2), Universal Serial Bus (USB), Bluetooth®, Radio Frequency (RF), and Infrared Data Association (IrDA).

In FIG. 1, input device 100 is shown as a proximity sensor device (also often referred to as a "touchpad" or a "touch sensor device") configured to sense input provided by one or more input objects 140 in a sensing region 120. Example input objects include fingers and styli, as shown in FIG. 1.

Sensing region 120 encompasses any space above, around, in and/or near input device 100, in which input device 100 is able to detect user input (e.g., user input provided by one or more input objects 140). The sizes, shapes, and locations of particular sensing regions may vary widely from embodiment to embodiment. In some embodiments, sensing region 120 extends from a surface of input device 100 in one or more directions into space until signal-to-noise ratios prevent sufficiently accurate object detection. The distance to which this sensing region 120 extends in a particular direction, in various embodiments, may be on the order of less than a millimeter, millimeters, centimeters, or more, and may vary significantly with the type of sensing technology used and the accuracy desired. Thus, some embodiments sense input that comprises no contact with any surfaces of input device 100, contact with an input surface (e.g., a touch surface) of input device 100, contact with an input surface of input device 100 coupled with some amount of applied force or pressure, and/or a combination thereof. In various embodiments, input surfaces may be provided by surfaces of casings within which the sensor electrodes reside, by face sheets applied over the sensor electrodes or any casings, etc. In some embodiments, sensing region 120 has a rectangular shape when projected onto an input surface of input device 100.

Input device 100 may utilize any combination of sensor components and sensing technologies to detect user input in sensing region 120. Input device 100 comprises one or more sensing elements for detecting user input. As a non-limiting example, input device 100 may use capacitive techniques.

Some implementations are configured to provide images that span one, two, three, or higher dimensional spaces. Some implementations are configured to provide projections of input along particular axes or planes.

In some capacitive implementations of input device 100, voltage or current is applied to create an electric field. Nearby input objects cause changes in the electric field, and produce detectable changes in capacitive coupling that may be detected as changes in voltage, current, or the like.

Some capacitive implementations utilize arrays or other regular or irregular patterns of capacitive sensing elements to create electric fields. In some capacitive implementations, separate sensing elements may be ohmically shorted together to form larger sensor electrodes. Some capacitive implementations utilize resistive sheets, which may be uniformly resistive.

Some capacitive implementations utilize "self capacitance" (or "absolute capacitance") sensing methods based on changes in the capacitive coupling between sensor electrodes and an input object. In various embodiments, an input object near the sensor electrodes alters the electric field near the sensor electrodes, thus changing the measured capacitive coupling. In one implementation, an absolute capacitance sensing method operates by modulating sensor electrodes with respect to a reference voltage (e.g., system ground), and by detecting the capacitive coupling between the sensor electrodes and input objects.

Some capacitive implementations utilize "mutual capacitance" (or "transcapacitance") sensing methods based on changes in the capacitive coupling between sensor electrodes. In various embodiments, an input object near the sensor electrodes alters the electric field between the sensor electrodes, thus changing the measured capacitive coupling. In one implementation, a transcapacitive sensing method operates by detecting the capacitive coupling between one or more transmitter sensor electrodes (also "transmitter electrodes" or "transmitters") and one or more receiver sensor electrodes (also "receiver electrodes" or "receivers"). Collectively transmitters and receivers may be referred to as sensor electrodes or sensor elements. Transmitter sensor electrodes may be modulated relative to a reference voltage (e.g., system ground) to transmit transmitter signals. Receiver sensor electrodes may be held substantially constant relative to the reference voltage to facilitate receipt of resulting signals. A resulting signal may comprise effect(s) corresponding to one or more transmitter signals, and/or to one or more sources of environmental interference (e.g., other electromagnetic signals). Sensor electrodes may be dedicated transmitters or receivers, or may be configured to both transmit and receive. In some embodiments, one or more receiver electrodes may be operated to receive a resulting signal when no transmitter electrodes are transmitting (e.g., the transmitters are disabled). In this manner, the resulting signal represents noise detected in the operating environment of sensing region 120.

In FIG. 1, a processing system 110 is shown as part of input device 100. Processing system 110 is configured to operate the hardware of input device 100 to detect input in sensing region 120. Processing system 110 comprises parts of or all of one or more integrated circuits (ICs) and/or other circuitry components. (For example, a processing system for a mutual capacitance sensor device may comprise transmitter circuitry configured to transmit signals with transmitter sensor electrodes, and/or receiver circuitry configured to receive signals with receiver sensor electrodes). In some embodiments, processing system 110 also comprises electronically-readable instructions, such as firmware code, software code, and/or the like. In some embodiments, components composing processing system 110 are located together, such as near sensing element(s) of input device 100. In other embodiments, components of processing system 110 are physically separate with one or more components close to sensing element(s) of input device 100, and one or more components elsewhere. For example, input device 100 may be a peripheral coupled to a desktop computer, and processing system 110 may comprise software configured to run on a central processing unit of the desktop computer and one or more ICs (perhaps with associated firmware) separate from the central processing unit. As another example, input device 100 may be physically integrated in a phone, and processing system 110 may comprise circuits and firmware that are part of a main processor of the phone. In some embodiments, processing system 110 is dedicated to implementing input device 100. In other embodiments, processing system 110 also performs other functions, such as operating display screens, driving haptic actuators, etc.

Processing system 110 may be implemented as a set of modules that handle different functions of processing system 110. Each module may comprise circuitry that is a part of processing system 110, firmware, software, or a combination thereof. In various embodiments, different combinations of modules may be used. Example modules include hardware operation modules for operating hardware such as sensor electrodes and display screens, data processing modules for processing data such as sensor signals and positional information, and reporting modules for reporting information. Further example modules include sensor operation modules configured to operate sensing element(s) to detect input, identification modules configured to identify gestures such as mode changing gestures, and mode changing modules for changing operation modes.

In some embodiments, processing system 110 responds to user input (or lack of user input) in sensing region 120 directly by causing one or more actions. Example actions include changing operation modes, as well as GUI actions such as cursor movement, selection, menu navigation, and other functions. In some embodiments, processing system 110 provides information about the input (or lack of input) to some part of the electronic system (e.g., to a central processing system of the electronic system that is separate from processing system 110, if such a separate central processing system exists). In some embodiments, some part of the electronic system processes information received from processing system 110 to act on user input, such as to facilitate a full range of actions, including mode changing actions and GUI actions.

For example, in some embodiments, processing system 110 operates the sensing element(s) of input device 100 to produce electrical signals indicative of input (or lack of input) in sensing region 120. Processing system 110 may perform any appropriate amount of processing on the electrical signals in producing the information provided to the electronic system. For example, processing system 110 may digitize analog electrical signals obtained from the sensor electrodes. As another example, processing system 110 may perform filtering or other signal conditioning. As yet another example, processing system 110 may subtract or otherwise account for a baseline, such that the information reflects a difference between the electrical signals and the baseline. As yet further examples, processing system 110 may determine positional information, recognize inputs as commands, recognize handwriting, and the like.

"Positional information" as used herein broadly encompasses absolute position, relative position, velocity, acceleration, and other types of spatial information. Exemplary "zero-dimensional" positional information includes near/far or contact/no contact information. Exemplary "one-dimensional" positional information includes positions along an axis. Exemplary "two-dimensional" positional information includes motions in a plane. Exemplary "three-dimensional" positional information includes instantaneous or average velocities in space. Further examples include other representations of spatial information. Historical data regarding one or more types of positional information may also be determined and/or stored, including, for example, historical data that tracks position, motion, or instantaneous velocity over time.

In some embodiments, input device 100 is implemented with additional input components that are operated by processing system 110 or by some other processing system. These additional input components may provide redundant functionality for input in sensing region 120, or some other functionality. FIG. 1 shows buttons 130 near sensing region 120 that can be used to facilitate selection of items using input device 100. Other types of additional input components include sliders, balls, wheels, switches, and the like. Conversely, in some embodiments, input device 100 may be implemented with no other input components.

In some embodiments, input device 100 may be a touch screen, and sensing region 120 overlaps at least part of an active area of a display screen. For example, input device 100 may comprise substantially transparent sensor electrodes overlaying the display screen and provide a touch screen interface for an associated electronic system. The display screen may be any type of dynamic display capable of displaying a visual interface to a user, and may include any type of light emitting diode (LED), organic LED (OLED), cathode ray tube (CRT), liquid crystal display (LCD), plasma, electroluminescence (EL), or other display technology. Input device 100 and the display screen may share physical elements. For example, some embodiments may utilize some of the same electrical components for displaying and sensing. As another example, the display screen may be operated in part or in total by processing system 110.

It should be understood that while many embodiments are described in the context of a fully functioning apparatus, the mechanisms are capable of being distributed as a program product (e.g., software) in a variety of forms. For example, the mechanisms that are described may be implemented and distributed as a software program on information bearing media that are readable by electronic processors (e.g., non-transitory computer-readable and/or recordable/writable information bearing media readable by processing system 110). Additionally, the embodiments apply equally regardless of the particular type of medium used to carry out the distribution. Examples of non-transitory, electronically readable media include various discs, memory sticks, memory cards, memory modules, and the like. Electronically readable media may be based on flash, optical, magnetic, holographic, or any other tangible storage technology.

Example Sensor Electrode Pattern

Figure 2:
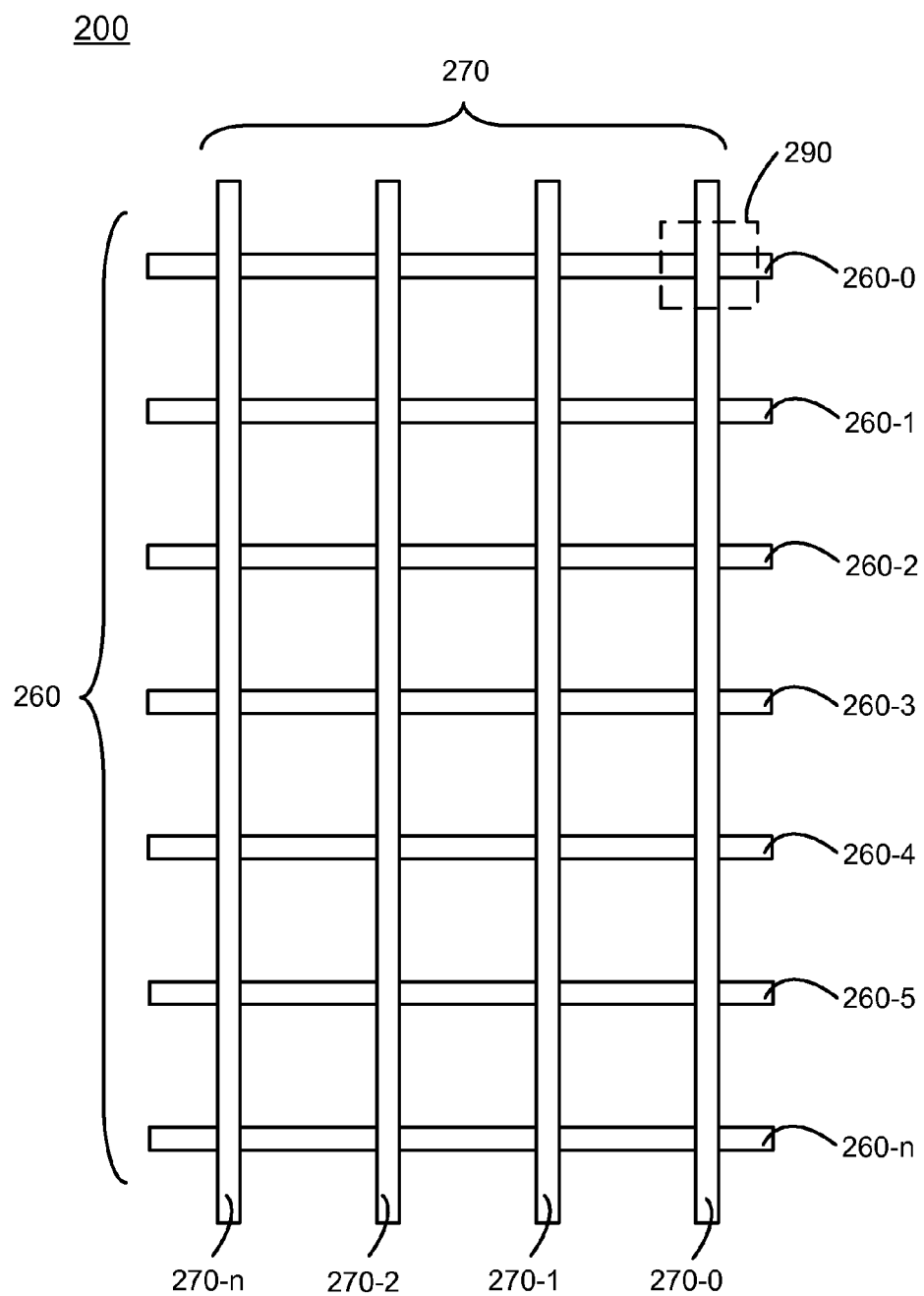
FIG. 2 shows a portion of an example sensor electrode pattern which may be utilized in a sensor to generate all or part of the sensing region of an input device, such as a touch screen, according to some embodiments.

FIG. 2 shows a portion of an example sensor electrode pattern 200 which may be utilized in a sensor to generate all or part of the sensing region of a input device 100, according to various embodiments. Input device 100 is configured as a capacitive input device when utilized with a capacitive sensor electrode pattern. For purposes of clarity of illustration and description, a non-limiting simple rectangular sensor electrode pattern 200 is illustrated. It is appreciated that numerous other sensor electrode patterns may be employed including patterns with a single set of sensor electrodes, patterns with two sets of sensor electrodes disposed in a single layer (without overlapping), and patterns that provide individual button electrodes. The illustrated sensor electrode pattern is made up of a plurality of receiver electrodes 270 (270-0, 270-1, 270-2 . . . 270-n) and a plurality of transmitter electrodes 260 (260-0, 260-1, 260-2 . . . 260-n) which overlay one another, in this example. In the illustrated example, touch sensing pixels are centered at locations where transmitter and receiver electrodes cross. Capacitive pixel 290 illustrates one of the capacitive pixels generated by sensor electrode pattern 200 during transcapacitive sensing. It is appreciated that in a crossing sensor electrode pattern, such as the illustrated example, some form of insulating material or substrate is typically disposed between transmitter electrodes 260 and receiver electrodes 270. However, in some embodiments, transmitter electrodes 260 and receiver electrodes 270 may be disposed on the same layer as one another through use of routing techniques and/or jumpers. In various embodiments, touch sensing includes sensing input objects anywhere in sensing region 120 and may comprise: no contact with any surfaces of the input device 100, contact with an input surface (e.g., a touch surface) of the input device 100, contact with an input surface of the input device 100 coupled with some amount of applied force or pressure, and/or a combination thereof.

When accomplishing transcapacitive measurements, capacitive pixels, such as capacitive pixel 290, are areas of localized capacitive coupling between transmitter electrodes 260 and receiver electrodes 270. The capacitive coupling between transmitter electrodes 260 and receiver electrodes 270 changes with the proximity and motion of input objects in the sensing region associated with transmitter electrodes 260 and receiver electrodes 270.

In some embodiments, sensor electrode pattern 200 is "scanned" to determine these capacitive couplings. That is, the transmitter electrodes 260 are driven to transmit transmitter signals. Transmitters may be operated such that one transmitter electrode transmits at one time, or multiple transmitter electrodes transmit at the same time. Where multiple transmitter electrodes transmit simultaneously, these multiple transmitter electrodes may transmit the same transmitter signal and produce an effectively larger transmitter electrode, or these multiple transmitter electrodes may transmit different transmitter signals. For example, multiple transmitter electrodes may transmit different transmitter signals according to one or more coding schemes that enable their combined effects on the resulting signals of receiver electrodes 270 to be independently determined.

The receiver electrodes 270 may be operated singly or multiply to acquire resulting signals. The resulting signals may be used to determine measurements of the capacitive couplings at the capacitive pixels.

A set of measurements from the capacitive pixels form a "capacitive image" (also "capacitive frame") representative of the capacitive couplings at the pixels. Multiple capacitive images may be acquired over multiple time periods, and differences between them used to derive information about input in the sensing region. For example, successive capacitive images acquired over successive periods of time can be used to track the motion(s) of one or more input objects entering, exiting, and within the sensing region.

In some embodiments, one or more sensor electrodes 260 or 270 may be operated to perform absolute capacitive sensing at a particular instance of time. For example, receiver electrode 270-0 may be charged and then the capacitance of receiver electrode 270-0 may be measured. In such an embodiment, an input object 140 interacting with receiver electrode 270-0 alters the electric field near receiver electrode 270-0, thus changing the measured capacitive coupling. In this same manner, a plurality of sensor electrodes 270 may be used to measure absolute capacitance and/or a plurality of sensor electrodes 260 may be used to measure absolute capacitance. It should be appreciated that when performing absolute capacitance measurements the labels of "receiver electrode" and "transmitter electrode" lose the significance that they have in transcapacitive measurement techniques, and instead a sensor electrode 260 or 270 may simply be referred to as a "sensor electrode."

Figure 3:
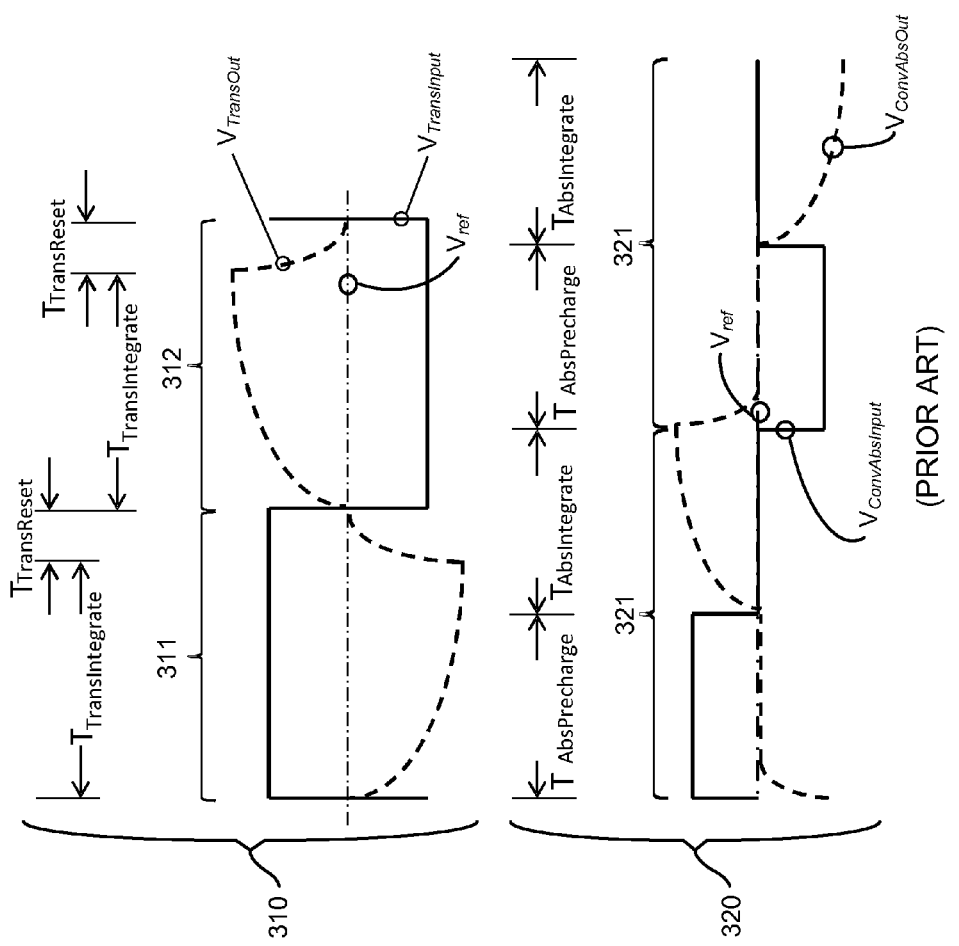
FIG. 3 shows a comparison of diagrams of transcapacitive and conventional absolute capacitance sensing signals and modes.

Comparison of Transcapacitive Sensing and
Conventional Absolute Capacitive Sensing FIG. 3 shows a comparison of diagrams of transcapacitive and conventional absolute capacitance sensing signals and modes (310 and 320 respectively). FIG. 3, portion 310 illustrates transmitter and integrated resulting signals ($V_{TransInput}$ and $V_{TransOut}$ respectively) for a transcapacitive sensing mode, where 311 is a first half of a transcapacitive sensing cycle and 312 is a second half of a transcapacitive sensing cycle. Each half transcapacitive sensing cycle (311, 312) comprises an integration time period, $T_{TransIntegrate}$, and a reset time period, $T_{TransReset}$. In FIG. 3, portion 320 illustrates transmitter and integrated resulting signals ($V_{ConvAbsInput}$ and $V_{ConvAbsOut}$ respectively) for an absolute capacitive sensing mode wherein 321 is the first half of a conventional absolute sensing cycle and 322 is the second half of the conventional absolute capacitive sensing cycle. Each half (321, 322) comprises one pre-charge time period, $T_{AbsPrecharge}$, and one integration time period, $T_{AbsIntegrate}$. In the illustrated embodiments, the transmitter and resulting signals differ for the two sensing modes. For example, the illustrated conventional absolute capacitive sensing mode comprises a pre-charge phase, $T_{AbsPrecharge}$, in which a sensor electrode is charged up to "voltage high" by the transmitter signal followed by an integration phase, $T_{AbsIntegrate}$, in which the sensor electrode is discharged and the resulting charge flow from the resulting signal is integrated and measured. For such an embodiment, the maximum amount of charge that may be measured by a capacitive measuring circuit coupled to the sensor electrode is $C_B$ ($V_{dd}/2$) where $C_B$ is the absolute capacitance (background capacitance+any input object capacitance) being measured and $V_{dd}$ is the receiver supply voltage (reference voltage or an operating voltage). For example, in this conventional absolute capacitive sensing operation the pre-charge phase, $T_{AbsPrecharge}$, and the integration phase, $T_{AbsIntegrate}$, durations may be based on the settling time of the sensor electrode, $T_{abs}$. This settling time precludes shortening these times without impact on the ability to sense. In many embodiments, as can be seen in FIG. 3, the transcapacitive sensing reset phase, $T_{TransReset}$, is much shorter than the conventional absolute sensing pre-charge ($T_{AbsPrecharge}$) or absolute sensing integrate phase ($T_{AbsIntegrate}$) which is less than the transcapacitive sensing integrate time, $T_{TransReset} \ll T_{aAbsPrecharge} < T_{TransInegrate}$. Therefore, the duration of a half sensing cycle for the conventional absolute capacitive sensing method, $T_{AbsPrecharge}\ T_{AbsIntegrate}$, is typically greater than the duration of a half sensing cycle for transcapacitive sensing method, $T_{TransReset}+T_{TransIntegrate}$. Further, since the half sensing cycle for the conventional absolute capacitive sensing method is greater than the half sensing cycle for transcapacitive sensing method, the transmitter signal frequency for absolute capacitive sensing is lower than the transmitter signal frequency for transcapacitive sensing.

Example Capacitive Charge Measuring Circuits

Figure 5:
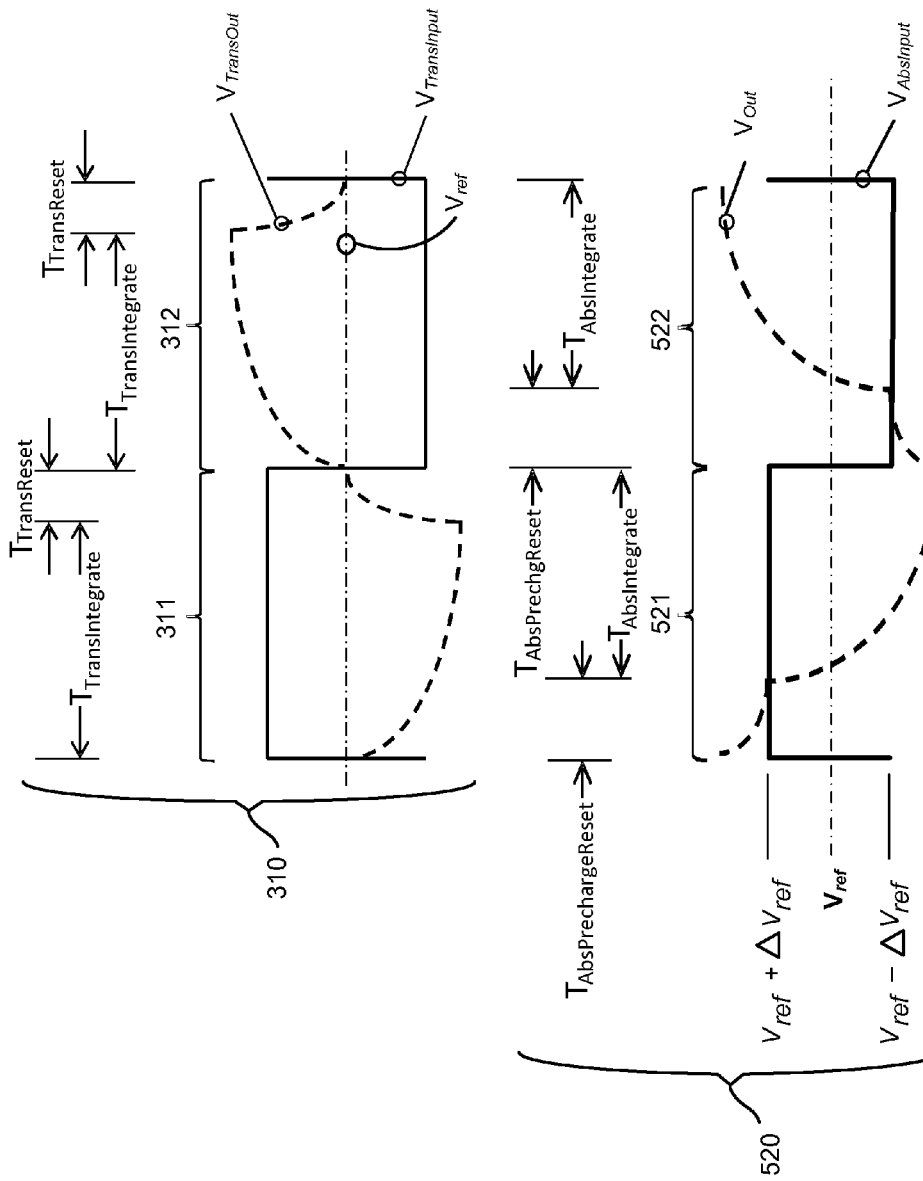
FIG. 5 shows a comparison of diagrams of transcapacitive and new (as described herein) absolute capacitance sensing signals and mode, in accordance with various embodiments.

As will be further described herein, in various embodiments, sensing frequency of an absolute capacitive sensing device may be improved (shortened), as compared to conventional techniques, by altering parameters of circuits and techniques used for performing absolute capacitive sensing. For an absolute capacitive sensing device described herein, increasing the amplitude and/or the frequency of transmitter signal may improve performance of the sensing device in comparison to conventional techniques of absolute capacitive sensing. For example, the signal-to-noise ratio may be increased, interference susceptibility may be improved and proximity sensing (distance and accuracy) may be improved by one or more of increasing the amplitude and/or frequency of the transmitter signal. In various embodiments, increasing the amplitude of the absolute sensing transmitter signal increases the proximity sensing distance and accuracy. Further, a capacitive sensing transmitter signal, such as $V_{AbsInput}$ of FIG. 5, having a higher frequency may increase the avoidance of lower frequency interference components. In yet other embodiments, an input device that is configured to operate with an absolute capacitance measurement transmitter signal, such as $V_{AbsInput}$ of FIG. 5, having increased amplitude and/or frequency (as compared with conventional techniques for absolute capacitive sensing), may be configured to operate with a transmitter signal similar to that of a transcapacitive sensing device. Such embodiments allow for the interference susceptibility to be substantially the same for both modes of capacitive sensing, thus allowing interference avoidance for the two different sensing modes can be coordinated. Further, an input device configured to operate in both a transcapacitive sensing mode and an absolute capacitive sensing mode may be referred to as a hybrid capacitive sensor device. In such embodiments, the absolute capacitive sensing transmitter signal frequency may be at least equal to, if not faster than, that of a transcapacitive transmitter signal. In one embodiment, as is depicted in FIG. 5, the half sensing cycle for an absolute capacitive sensing method may be at least equal to, if not faster than, that of a transcapacitive sensing method. This will be described in more detail below.

A hybrid capacitive sensing device may be configured to operate in both a transcapacitive sensing mode and an absolute capacitive sensing mode. In one embodiment, the hybrid capacitive sensing device is configured to switch between a transcapacitive sensing mode and an absolute capacitive sensing mode based on, but not limited to, an operating state of the input device, an input object event and a time delay. By way of example and not of limitation, in one embodiment, an absolute capacitive sensing mode may be used to detect the presence of an input object above, but not touching an input surface of an input device, and in response to detection of such an input object the input device may switch from an absolute capacitive sensing mode to a transcapacitive sensing mode.

In various embodiments, the amplitude and frequency of the absolute capacitive sensing transmitter signal, $V_{AbsInput}$, may be increased in comparison to the sensing frequency that is possible using conventional absolute capacitive sensing. In such embodiments, the reference voltage (operating voltage) of the charge integrator of the capacitance measuring circuit coupled to the sensor electrode may be modulated. The reference voltage may be modulated symmetrically above and below a reference value. The frequency and/or amplitude of the modulation may be adjusted during operation, such as to avoid interference, prevent saturation, or adjust the dynamic range of an amplifier. For example, the reference voltage may be modulated with signal that is similar to the transcapacitive sensing signal (e.g., $V_{TransInput}$) in waveform and/or frequency (for example a square wave with similar frequency). In such an embodiment, the reference voltage, $V_{ref}$, may be an attenuated version of the transcapacitive sensing signal. In other embodiments, the reference voltage may be modulated based on a receiver module supply voltage. In such an embodiment, the reference voltage, $V_{ref}$, may be an attenuated version of the receiver module supply voltage, such as $1/2V_{dd}$. Further, in various embodiments, the reference voltage may be variable. In other embodiments, the reference voltage may be selected and configured to increase the dynamic range of the differential amplifier being used as a charge integrator. In another embodiment, the reference voltage and the feedback capacitance may be selected to increase the dynamic range of the differential amplifier being used as a charge integrator. Further, in other embodiments, the differential amplifier being used as a charge integrator may be decoupled from the sensor electrode or electrodes which are being used for absolute capacitive sensing during a reset phase of the charge integrator. In one embodiment, decoupling the charge integrator from the sensor electrode during the reset phase provides a shorter reset phase for the charge integrator than would be experienced if it were to remain coupled to the sensor electrode during the reset phase. In some embodiments, the same charge integrator may be configured to receive resulting signals while an input device operates in a transcapacitive sensing mode and an absolute capacitive sensing mode. Further, in some embodiments, the transcapacitive sensing mode and the absolute sensing mode may be configured to use similar transmitter signals (similar in at least one of frequency and amplitude). In some such embodiments, transmitter frequency and the sensing cycles for the transcapacitive sensing mode and the absolute sensing mode are configured to be substantially the same. For example, the absolute capacitive sensing "pre-charge/reset" and "integrate" durations, when combined are substantially equal to the reset and integrate times for transcapacitive sensing. The following example embodiments, describes various ways to provide an absolute capacitive sensing having a reduced sensing cycle and an increased transmitter signal frequency.

Figure 4A:
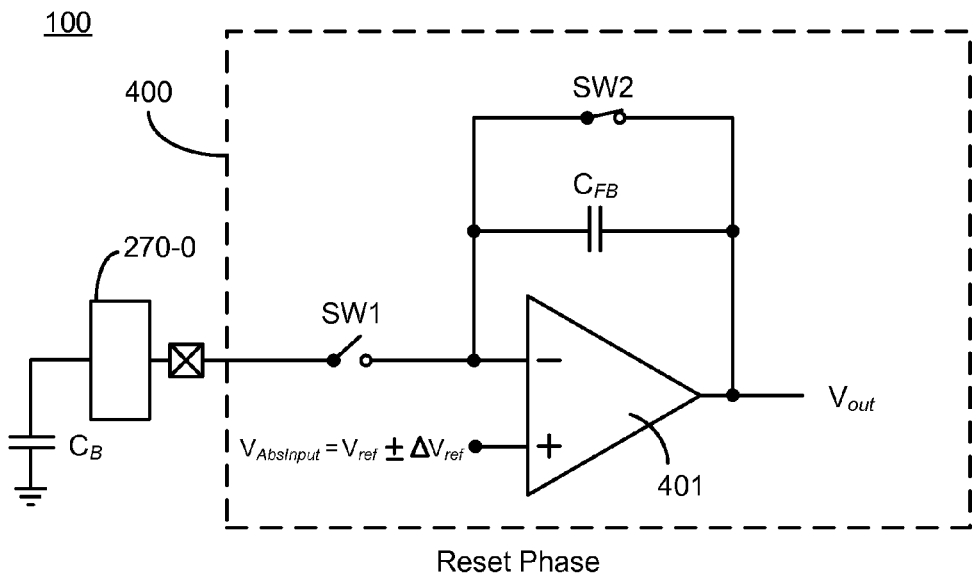
FIGS. 4A and 4B illustrate operation of a capacitance measurement circuit through a first half cycle of absolute capacitive sensing, according to an embodiment.
Figure 4B:
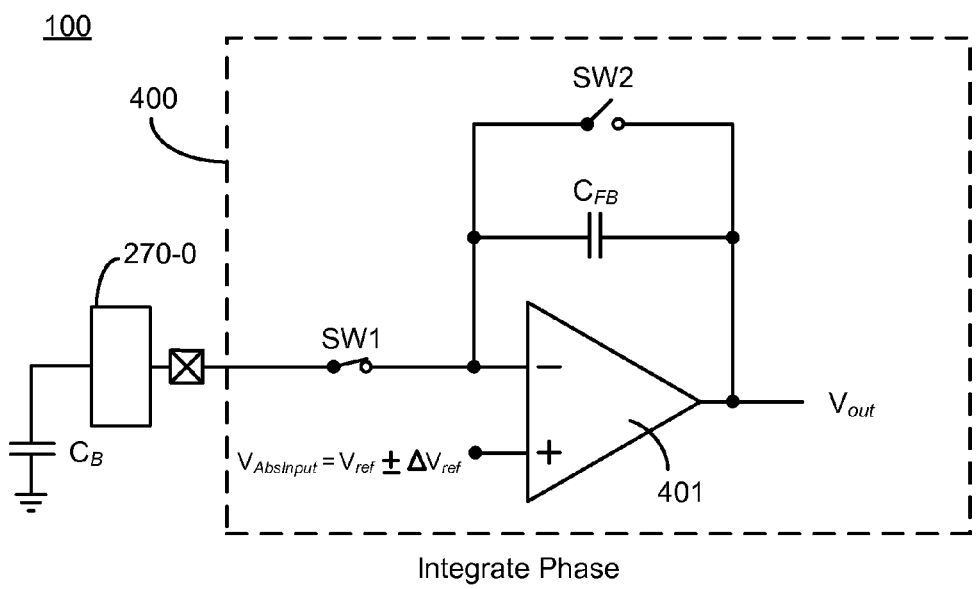

FIGS. 4A and 4B illustrate operation of a capacitance measurement circuit 400 through a first half cycle of absolute capacitive sensing, according to an embodiment. Capacitance measurement circuit 400 may be included as part of an input device 100 and/or a processing system 110. For example, processing system 110 may supply input voltages for circuit 400 as well as control signals which operate switches in circuit 400 and/or select capacitors from a bank of selectable capacitors. In FIGS. 4A and 4B, capacitance measurement circuit 400 comprises a differential amplifier 401 with inverting and non-inverting inputs and an output. A first switch SW1 is coupled between the non-inverting input of differential amplifier 401 and a sensor electrode, such as sensor electrode 270-0, to which circuit 400 is coupled. Differential amplifier 401 is configured as a charge integrator and includes a feedback capacitance disposed between its output and its inverting input. The feedback capacitance is represented by capacitor, $C_{FB}$, that is coupled on one side to the output of differential amplifier 401 and on its other side to a location between the inverting input of differential amplifier 401 and switch SW1. It should be appreciated that capacitor $C_{FB}$ can be composed of one or more selectable capacitances that are selected from bank(s) of selectable capacitors. A second switch, SW2 is disposed in parallel with feedback capacitor $C_{FB}$. Switch SW2 operates as a reset mechanism to discharge and reset capacitor $C_{FB}$. In FIGS. 4A and 4B, capacitance CB represents a background capacitance (which may include capacitance contributed by an input object) between sensor electrode 270-0 and ground.

Capacitance measurement circuit 400 performs an absolute sensing method having a reduced half sensing cycle (as compared to conventional absolute capacitive sensing cycles), where differential amplifier 401 is set up as a charge integrator and the reference voltage applied to the non-inverting input of differential amplifier 401 is modulated by substantially equal amounts above and below a reference voltage $V_{ref}$. In some embodiments, the reference voltage of the integrating amplifier is modulated with a similar signal to the transcapacitive transmitter signal. In some embodiments, $V_{ref}$ is approximately one half of a supply voltage, VDD. In such an embodiment, the absolute capacitive sensing frequency may be increased by using the propensity of differential amplifier 401 to balance voltages on its inputs to drive a transmitter signal onto sensor electrode 270-0 which is equal to the modulated voltage applied on the non-inverting input. This method of driving is different than conventional absolute capacitive sensing which uses a transmitter that is separate from a charge integrator.

FIG. 4A illustrates the reset phase of the first half sensing cycle. During this reset phase, the feedback capacitor, $C_{FB}$, is discharged and $V_{out}$ follows the $V_{inp}$ reference voltage, $V_{AbsInput}$, that is modulated onto the non-inverting input of differential amplifier 401. In the reset phase: switch SW2 is closed and switch SW1 is opened; and the polarity of the modulation of $V_{AbsInput}$ switches. The shift in reference voltage, $V_{AbsInput}$, can occur at the very beginning of the reset phase or at some time after the reset phase has started. In some embodiments, when switch SW1 is open, sensor electrode 270-1 is left to electrically float and thus substantially maintains whatever charge remained upon it. Closing switch SW2 causes capacitor $C_{FB}$ to discharge. The output and inverting input then take some time to settle to the new value of $V_{AbsInput}$. The length of reset phase is predicated upon how long the settling and discharge take to occur. The discharge of $C_{FB}$ is fairly quick as there is no resistance in the path to slow it, and the reset time of differential amplifier 401 is hastened by opening SW1 to disconnect it from sensor electrode 270-0 so that it can more quickly settle without the capacitance of sensor electrode 270-0 coupled to its inverting input.

FIG. 4B illustrates the integration phase of the first half sensing cycle. The integration phases are time periods where measurement takes place and may also be referred to as measurement phases. In this integration phase, the non-inverting node of differential amplifier 401 continues to be driven to the same value of $V_{AbsInput}$ as during the reset phase shown in FIG. 4A. At the beginning of the integration phase $C_{FB}$ is discharged and both inputs and the output of differential amplifier 401 have substantially settled at the voltage $V_{AbsInput}$ being applied to the non-inverting input. To initiate the integration phase, switch SW1 is closed and switch SW2 is opened. This causes the sensor electrode (e.g., 270-0) to be connected to the inverting input of integrating differential amplifier 401, which in-turn causes the voltage on background capacitance, $C_B$, to be driven from the previous voltage level that it maintained after being decoupled from circuit 400 to the new voltage that is present on the inverting input of differential amplifier 401. For example in one integration cycle, $C_B$ would be driven from an old voltage of $V_{ref}-\Delta V_{ref}$ to a new voltage of $V_{ref}+\times V_{ref}$, while in the following integration cycle on the next half sensing cycle $C_B$ would be driven from an old voltage of $V_{ref}+\Delta V_{ref}$ to a new voltage of $V_{ref}+\times V_{ref}$. Thus, a charge of $2\Delta V_{ref}C_B$ flows into $C_B$ from $C_{FB}$ and causes $V_{out}$ to change from $V_{ref}\pm\Delta V_{ref}$ by $2\Delta V_{ref} C_B/C_{FB}$.

FIG. 5 shows a comparison of diagrams of transcapacitive and new (as described herein) absolute capacitance sensing signals and modes (310 and 520 respectively), in accordance with various embodiments. Portion 310 is the same as portion 310 of FIG. 3. Portion 520 illustrates a full absolute capacitive sensing cycle, according to embodiments described herein in FIGS. 4A, 4B, 6A-6D, and FIG. 7. In FIG. 5, portion 520 illustrates transmitter and integrated resulting signals ($V_{AbsInput}$ and $V_{out}$ respectively) for an absolute capacitive sensing mode wherein 521 is the first half of a sensing cycle and 522 is the second half of a capacitive sensing cycle. Each half sensing cycle 521 or 522 includes both a pre-charge/reset phase, $T_{AbsPrechargeReset}$, and an integration phase, $T_{AbsInegrate}$. The integration phases are time periods where measurement takes place and may also be referred to as measurement phases. The pre-charge/reset phase may include only reset (as illustrated in FIGS. 4A and 4B), some combination of reset and pre-charge (as illustrated in FIGS. 6A-6D), or only pre-charge as illustrated in FIG. 7. As can be seen, absolute capacitive measurement is accomplished with a reduced half sensing cycle period (as compared to conventional techniques of absolute capacitive sensing illustrated in FIG. 3). Although the pre-charge/reset phase is shown as being substantially the same length of time as the integration phase where measurement takes place, it should be appreciated that in some embodiments described herein the pre-charge/reset phase is shorter than the integration phase in a half sensing cycle such as 521 or 522. In some embodiments, for example, the pre-charge/reset phase may be an order of magnitude or more shorter than the integration phase in a half sensing cycle such as 521 or 522. Further, as can be seen from FIG. 5, the reset phase is shorter than the pre-charge phase of FIG. 3, providing a higher sensing frequency. It should also be noted that in some embodiments, the pre-charge/reset phase illustrated in FIG. 5 is substantially equal to or shorter than the reset phase of transcapacitive sensing using the same sensor electrode. As the reset phase during transcapacitive sensing may be ⅕, 1/10, or less of the transcapacitive integration phase, this means that the pre-charge/reset phase illustrated in FIG. 5 is substantially shorter than the conventional absolute sensing pre-charge phase illustrated in 320 of FIG. 3. Further, in some embodiments, the combination of pre-charge/reset phase and integration phase in a half sensing cycle (e.g., half sensing cycle 521 or 522) is substantially equal to or shorter than a half sensing cycle of transcapacitive sensing (e.g., 311 or 312) accomplished using the same sensor electrode. Additionally, when $2\Delta V_{ref} > V_{dd}/2$, the absolute capacitive sensing transmitter signal which drives the sensor electrode can have a higher modulation amplitude than in the conventional technique for absolute capacitive sensing described in relation to FIG. 3.

In one embodiment, as illustrated in FIG. 4B, the output is given by Equation 1.

$$V_{out} = V_{ref} \mp \left(2\frac{C_B}{C_{FB}}\Delta V_f - \Delta V_{ref}\right) \quad \text{Equation 1}$$

As can be seen in Equation 1, the dynamic range of the output voltage is limited by the $\Delta V_{ref}$ term. In various embodiments, as can be seen in Equation 1, since last term is a signal which does not depend on $C_B$, the capacitance to be measured, when $C_B=0$, $V_{out} \neq V_{ref}$. However, in Equation 1, when $C_B=0$ then $V_{out}=V_{ref} \pm \Delta V_{ref}$. Thus, in such an embodiment, the system may be affine, but not linear, in $C_B$ around $V_{ref}$.

FIGS. 6A-6D illustrate operation of an capacitive measurement circuit 600 through a full cycle of absolute capacitive sensing, according to an embodiment. Capacitance measurement circuit 600 may be included as part of an input device 100 and/or a processing system 110. For example, processing system 110 may supply input voltages for circuit 600 as well as control signals which operate switches in circuit 600 and/or select capacitors from one or more banks of selectable capacitors. In FIGS. 6A-6D the feedback capacitance $C_{FB0}$ of FIGS. 4A and 4B has been split into multiple portions, $C_{FB0}$ and $C_{FB1}$, so that one portion $C_{FB0}$ can be reset while the other portion $C_{FB1}$ is pre-charged to either $2V_{ref}$ or ground during the pre-charge/reset phase of a half sensing cycle. The selection of whether CFB1 is pre-charged to $2V_{ref}$ or ground is accomplished by the positioning of switch SW3 during the pre-charge/reset phase of a half sensing cycle. In FIG. 6A-6D, the ratios of feedback capacitors $C_{FB0}$ and $C_{FB1}$ may be chosen to provide a charge integrator output, $V_{out}$, which is a linear function of the background capacitance, $C_B$, while maintaining the same sensing frequency increases as the method and circuit 400 shown in FIGS. 4A and 4B. By using the pre-charged portion of $C_{FB}$ as a charge subtractor, the embodiment of FIGS. 6A-6D can also handle larger values of $C_B$ without saturating the receiver, increasing the dynamic range of the receiver. For a given value of feedback capacitor $C_{FB}$ from FIGS. 4A and 4B, the capacitor is separated into two parallel capacitors $C_{FB0}$ and $C_{FB1}$. It should be appreciated that each of capacitors $C_{FB0}$ and $C_{FB1}$ may be composed of one or more selectable capacitors selected from banks of selectable capacitances. As the total feedback capacitance is the sum of the capacitances of $C_{FB0}$ and $C_{FB1}$, feedback capacitor $C_{FB}$ may be described as shown in Equation 2.

$$C_{FB} = C_{FB0} + C_{FB1} \quad \text{Equation 2}$$

The ratio of these two capacitors may be chosen as a function of the modulation amplitude, $\times V_{ref}$, in order to substantially reduce the offset term of Equation 1. In one embodiment, for each sensing cycle, there are two half cycles, with each half cycle having a reset phase followed by an integration phase. The integration phases are time periods where measurement takes place and may also be referred to as measurement phases.

Figure 6A:
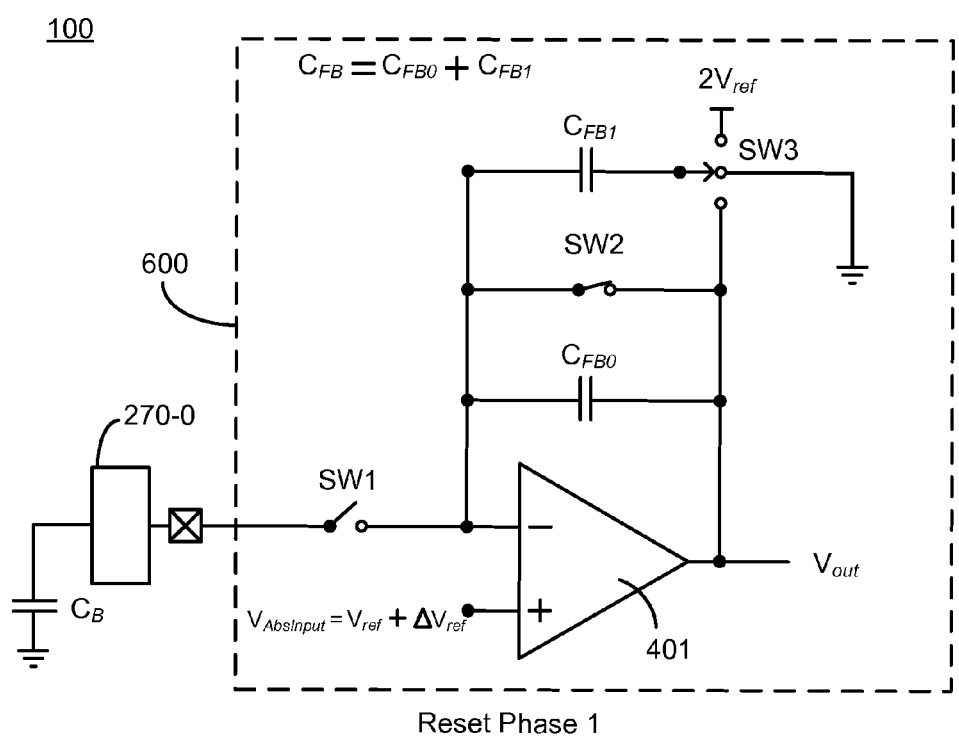
FIGS. 6A-6D illustrate operation of an capacitive measurement circuit through a full cycle of absolute capacitive sensing, according to an embodiment.
Figure 7:
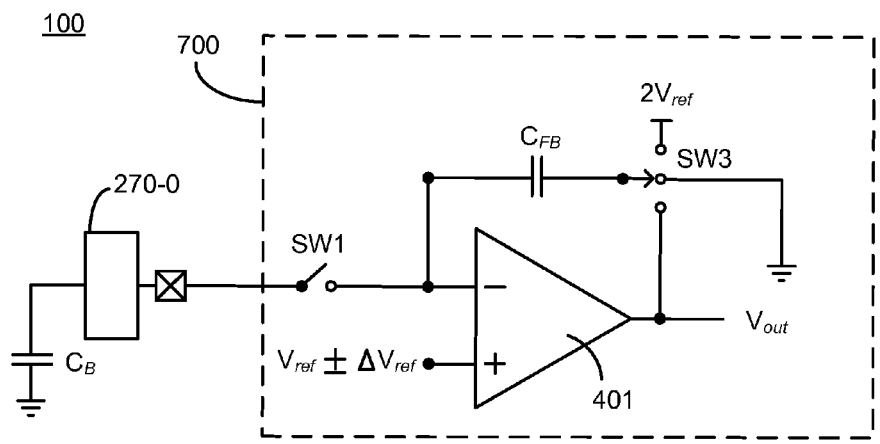
FIG. 7 illustrates a capacitance measurement circuit, according to an embodiment.

During the first half cycle's reset phase, which is illustrated in FIG. 6A as reset phase 1: switch SW1 is opened to decouple circuit 600 from sensor electrode 270-0; $C_{FB0}$ is discharged by closing switch SW2; the modulation of $V_{AbsInput}$ on the non-inverting input of differential amplifier 401 is shifted to $V_{ref}+\Delta V_{ref}$; and $C_{FB1}$ is pre-charged with $-(V_{ref}+\Delta V_{ref})C_{FB1}$ coulombs by coupling switch SW3 with a voltage of $2V_{ref}$ (which may be at or near $V_{dd}$ in some embodiments). The shift in reference voltage, $V_{AbsInput}$, can occur at the very beginning of the reset phase or at some time after the reset phase has started. Switch SW2 operates as a reset mechanism to discharge and reset capacitor $C_{FB0}$ additionally, switch SW3 also operates as a reset mechanism by allowing capacitor $C_{FB1}$ to be pre-charged and reset to a selected value. In some embodiments, when switch SW1 is open, sensor electrode 270-1 is left to electrically float and thus substantially maintains whatever charge remained upon it.

Figure 6B:
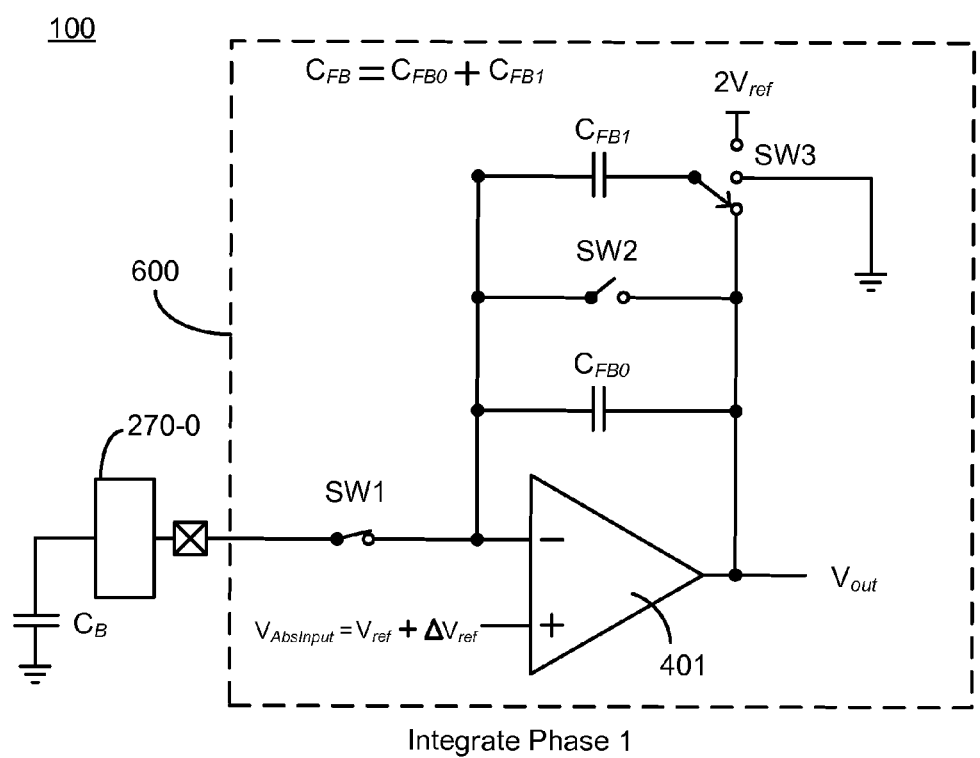

During the first half cycle's integrate phase, which is illustrated in FIG. 6B as integrate phase 1: $C_{FB0}$ and $C_{FB1}$ are placed in parallel by coupling switch SW3 with the output of differential amplifier 401 and opening switch SW2; and the inverting input of differential amplifier 401 is connected to $C_B$ by closing switch SW1. This causes the pre-charge stored on $C_{FB1}$ and any remaining charge to flow through $C_{FB0}+C_{FB1}$ to charge $C_B$ with $C_B(V_{ref}+\Delta V_{ref})$ coulombs.

Figure 6C:
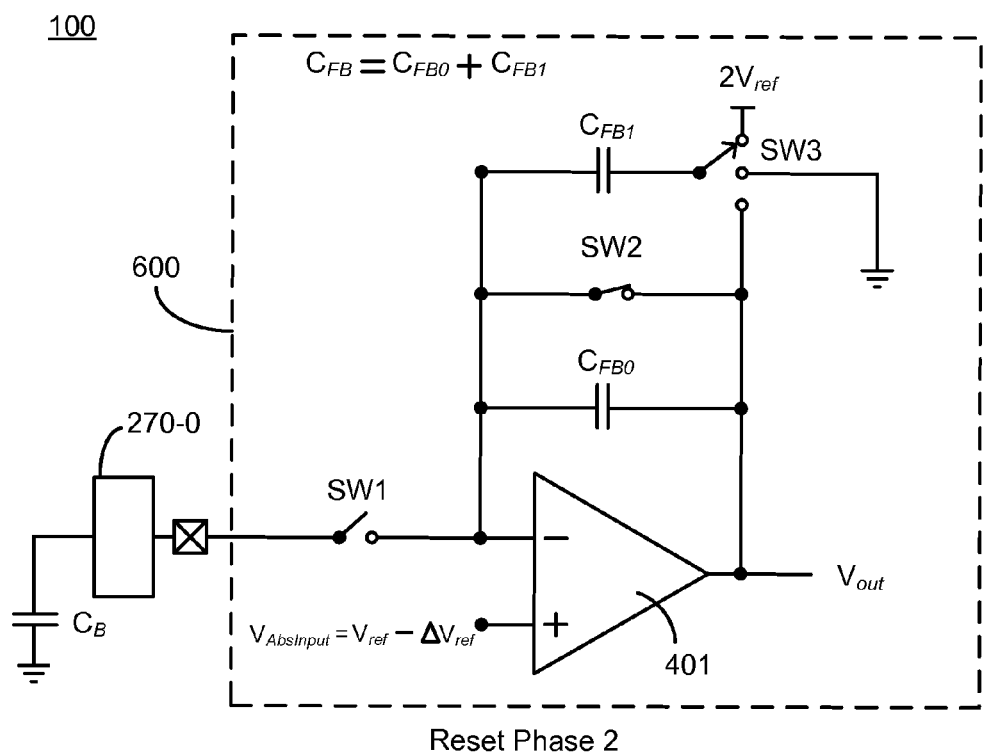
Figure 6D:
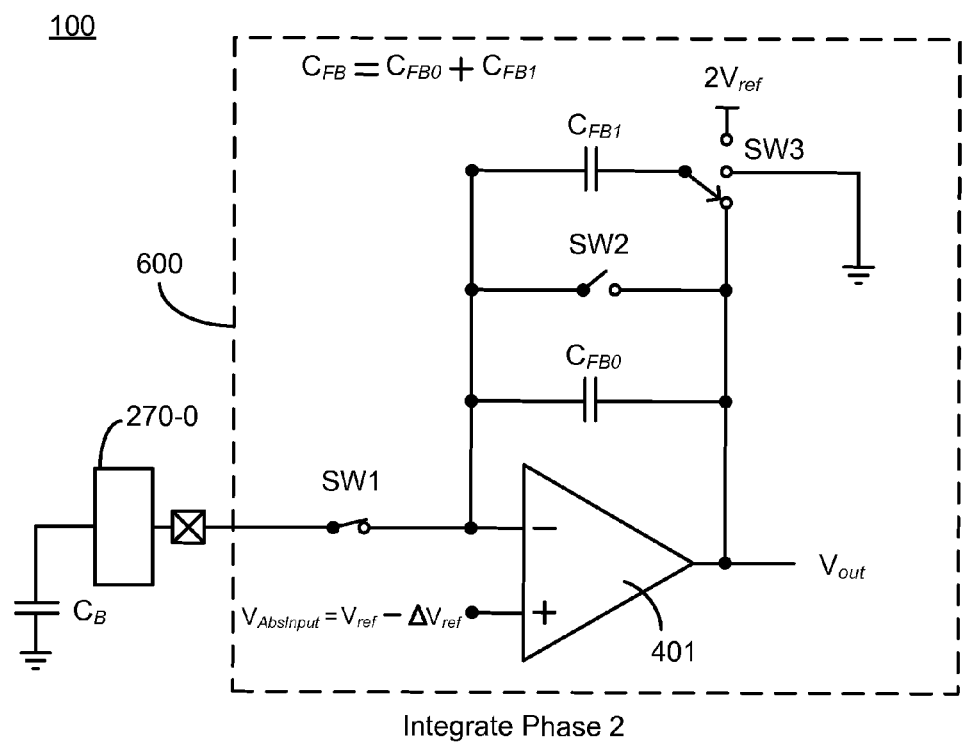

Similar operations to those illustrated in FIGS. 6A and 6B take place during the second half-cycle, illustrated in FIGS. 6C and 6D, except the reference voltage of the amplifier, $V_{AbsInput}$, is shifted to $V_{ref}-\Delta V_{ref}$ and $C_{FB1}$ is pre-charged with $(V_{ref}+\Delta V_{ref})C_{FB1}$ coulombs.

During the second half cycle's reset phase, which is illustrated in FIG. 6C as reset phase 2: switch SW1 is opened to decouple circuit 600 from sensor electrode 270-0; $C_{FB0}$ is discharged by closing switch SW2; the modulation of $V_{AbsInput}$ on the non-inverting input of differential amplifier 401 is shifted to $V_{ref}-\Delta V_{ref}$; and $C_{FB1}$ is pre-charged with $(V_{ref}+\Delta V_{ref})C_{FB1}$ coulombs by coupling switch SW3 with ground.

During the second half cycle's integrate phase, which is illustrated in FIG. 6D as integrate phase 2: $C_{FB0}$ and $C_{FB1}$ are placed in parallel by coupling switch SW3 with the output of differential amplifier 401 and opening switch SW2; and the inverting input of differential amplifier 401 is connected to $C_B$ by closing switch SW1. This causes the pre-charge stored on $C_{FB1}$ and any remaining charge to flow through $C_{FB0}+C_{FB1}$ to charge $C_B$ with $C_B(V_{ref}-\Delta V_{ref})$ coulombs.

In one embodiment, $C_{FB1}$ may be configured to increase the dynamic range of the receiver channel by acting as a charge subtractor which subtracts charge from CB, and thus presents a smaller signal from sensor electrode 270-0 for application by differential amplifier 401. Similarly stated, in various embodiments, $C_{FB1}$ may be configured to increase the range of $C_B$ that may be measured by the receiver channel of processing system 110 that is operating in absolute capacitance sensing mode. Further, $C_{FB1}$ may be configured to increase the range of the modulation of the reference voltage for the receiver channel. For example, $C_{FB1}$ may be configured to increase $\Delta V_{ref}$. Further, in various embodiments, the value of $C_{FB0}$ may be selected to achieve different levels of interference rejection. Further, in various embodiments, the value of $C_{FB0}$ may be selected to achieve different levels of gain (affecting signal to noise ratio (SNR), and sensitivity). In another embodiment, the value of $C_{FB1}$ may be selected to achieve different levels of charge subtraction. In yet another embodiment, the values of $C_{FB0}$ and $C_{FB1}$ may be selected in concert with one another to achieve different levels of charge subtraction.

For the example shown in FIGS. 6A-6D, the $V_{out}$ from differential amplifier 401 may be given by Equation 3.

$$V_{out} = V_{ref} \mp \left(2\frac{C_B}{C_{FB}}\Delta V_{ref} + \frac{C_{FB}-C_{FB1}}{C_{FB}}\Delta V_{ref} - \frac{C_{FB1}}{C_{FB}}V_{ref}\right) \quad \text{Equation 3}$$

The modulation amplitude, a, may then be defined as shown in Equation 4.

$$\Delta V_{ref} = \alpha V_{ref} \text{ where for some, } 0 < \alpha \leq 1 \quad \text{Equation 4}$$

Selection of α as shown in Equation 5 causes the last two terms of Equation 3 to cancel out and the output is therefore represented more simply, as shown in Equation 6.

$$\alpha = \frac{C_{FB1}}{C_{FB} - C_{FB1}} = \frac{C_{FB1}}{C_{FB0}} \quad \text{Equation 5}$$

$$V_{out} = V_{ref} \mp 2\frac{C_B}{C_{FB}}\Delta V_{ref} \quad \text{Equation 6}$$

The output, $V_{out}$, may be centered around $V_{ref}$ and linear in $C_B$. In various embodiments, for a known $C_{FB}$ and α, Equation 5 can be used to determine the values for $C_{FB0}$ and $C_{FB1}$. It should be appreciated that the simplification illustrated in Equation 5 is shown by way of example and not of limitation. That is to say, in other embodiments, the simplified case of Equation 5 does not have to hold, and Equation 3 is not simplified in the manner demonstrated by Equation 5.

FIG. 7 illustrates a capacitance measurement circuit 700, according to an embodiment. FIG. 7 illustrates an alternative implementation for absolute capacitance sensing to the embodiments illustrated in FIGS. 6A-6D and 4A and 4B. The implementation of FIG. 7 is similar to the methods described in relation to and depicted in FIGS. 6A-6D if $C_{FB0}$ in those embodiments is set to a zero capacitance value or not included and $C_{FB1}$ is set to some non-zero value. The operation of circuit 700 is the same as the operation of circuit 600, except that switch SW2 and capacitor $C_{FB0}$, and thus the entire $C_{FB}$ (composed only of $C_{FB1}$) is pre-charged during both reset phase 1 and reset phase 2. SW3 operates as a reset mechanism by allowing capacitor $C_{FB}$ to be pre-charged and reset to a selected value.

With circuit 700, as is similarly described above for circuits 400 and 600, for each sensing cycle there are two half cycles, where each half cycle has a reset phase followed by an integration phase. The integration phases are time periods where measurement takes place and may also be referred to as measurement phases. In the first half cycle's reset phase: switch SW1 is opened to decouple circuit 400 from sensor electrode 270-1; $C_{FB}$ is pre-charged by coupling switch SW3 with a voltage 2Vref; and the reference voltage, $V_{AbsInput}$, of differential amplifier 401 is shifted to $V_{ref}\Delta V_{ref}$. The shift in reference voltage, $V_{AbsInput}$, can occur at the very beginning of the reset phase or at some time after the reset phase has started. In some embodiments, when switch SW1 is open, sensor electrode 270-1 is left to electrically float and thus substantially maintains whatever charge remained upon it. Then during the integrate phase of the first half cycle: switch SW1 is closed to couple circuit 400 with sensor electrode 270-0; switch SW3 is coupled with the output of differential amplifier 401. These actions result in both $C_{FB}$ and $C_B$ being connected to the differential amplifier 401 during this integrate phase. The pre-charge stored on $C_{FB}$ charges $C_B$ with $C_B(V_{ref}+\Delta V_{ref})$ coulombs. A similar operation takes place in the second half-cycle except the operating point of the amplifier is shifted to $V_{ref}-\Delta V_{ref}$ and $C_{FB}$ is pre-charged with $(V_{ref}+\Delta V_{ref})C_{FB}$ coulombs by positioning switch SW3 such that it is coupled with ground.

The integrator output, $V_{out}$, for circuit 700 is given by Equation 7 at the end of the first cycle integrate and second cycle integrate phases, respectively.

$$V_{out} = \begin{cases} 2\frac{C_B}{C_{FB}}\Delta V_{ref} \\ 2V_{ref} - 2\frac{C_B}{C_{FB}}\Delta V_{ref} \end{cases} \quad \text{Equation 7}$$

In the embodiment illustrated in FIG. 7, the integrator output is a linear function of $C_B$ while maintaining the same advantages as described above in relation to FIGS. 4A-6D. In some embodiments of circuit 700, one or more techniques can also be employed to prevent inadvertent saturation of differential amplifier 401 by peak transients. For example, in some embodiments one or more resistors can be added to attenuate peak transients on the inverting input to amplifier 401 to prevent charge loss through open switches and inadvertent saturation of amplifier 401; in some embodiments, the timing of the operation of switches SW1 and SW3 can be adjusted such that for example switch SW1 remains open during a transition from a reset phase to an integrate phase until after switch SW3 is moved from either 2Vref or Ground to being coupled with $V_{out}$ or else is switch SW1 is closed and then switch SW3 is repositioned from either $2V_{ref}$ or Ground to being coupled with $V_{out}$. In some embodiments a combination of one or more added resistors and alterations in the timing of the operation of switches SW1 and SW3 may be utilized.

Figure 8:
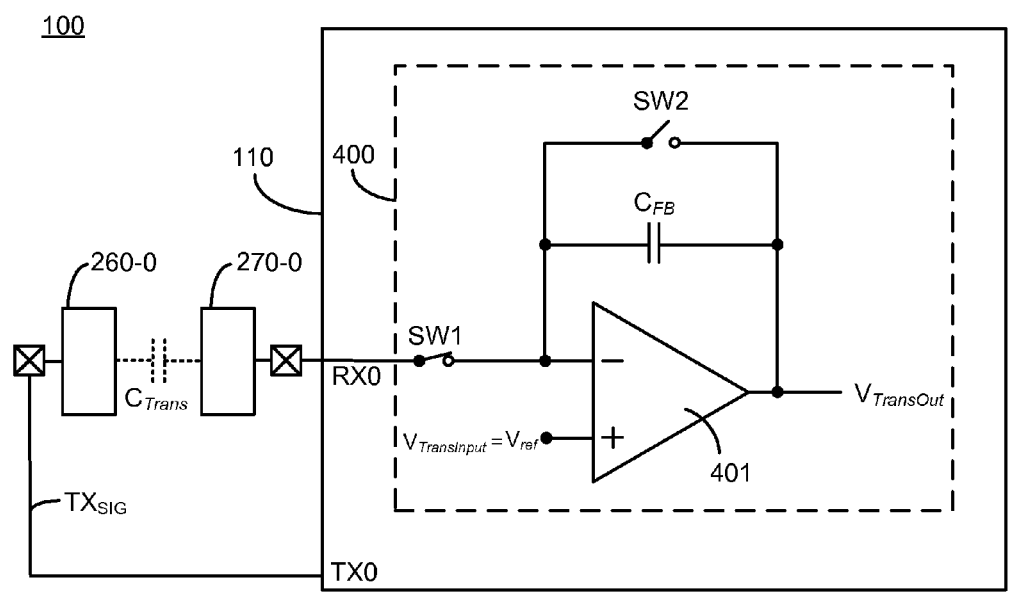
FIG. 8 illustrates a capacitance measurement circuit, according to some embodiments.

FIG. 8 illustrates a capacitance measurement circuit 400, according to some embodiments. For example, circuit 400 of FIGS. 4A and 4B is illustrated in as being used as a charge integrator for transcapacitive sensing. This is an embodiment of the hybrid capacitive sensing device that was previously mentioned herein. In FIG. 8, a transmitter output, TX0 of processing system 110 drives a first sensor electrode (e.g., transmitter electrode 260-0) with a transmitter signal, $TX_{SIG}$. A transcapacitance $C_{TRANS}$ between transmitter electrode 260-0 and another sensor electrode (e.g., receiver electrode 270-0) couples a resulting signal from this transmitter signal into this other sensor electrode (e.g., receiver electrode 270-0). By supplying a fixed $V_{ref}$ voltage on the non-inverting input of differential amplifier 401 and closing switch SW1, this resulting signal can be received at input RX0 (the inverting input of differential amplifier 401) and integrated by differential amplifier 401 so that the transcapacitive coupling is measured. It should be appreciated that circuits 600 and 700 may be operated in a similar manner to perform transcapacitive sensing as part of a hybrid capacitive sensing circuit.

While many of the above embodiments are described in relation to a differential amplifier 401 that configured as an integrating amplifier, similar approaches may be applied to embodiments comprising other types of charge integrating techniques such as those comprising current conveyors. Further, while in many embodiments a reset switch is employed to reset all or a portion of the feedback capacitance in the capacitive sensing circuit, in other embodiments, a resistor may be used. It should also be appreciated that while the illustrated examples illustrate only a single capacitive sensing circuit a processing system 110 may include numerous capacitive sensing circuits, such as one per receiver channel.

Example Methods of Measuring Capacitance

Figure 9B:
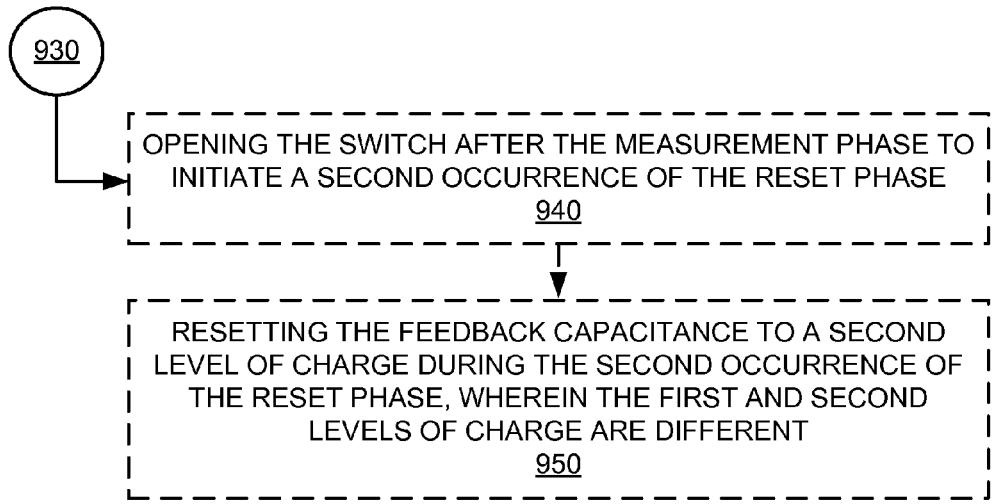
Figure 9C:
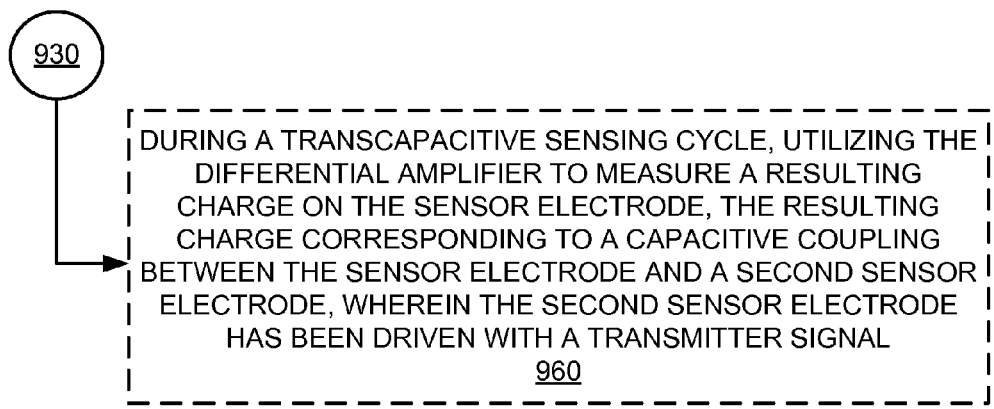

FIGS. 9A-9C illustrate a flow diagram 900 of a method of capacitance measurement with a differential amplifier having an output and differential first and second input, according to various embodiments. In discussion of flow diagram 900 reference will be made to components and operates illustrated in one or more of FIGS. 6A-6D, FIGS. 4A-4B, and FIG. 7.

At procedure 910 of flow diagram 900, in one embodiment, a switch disposed between a sensor electrode and a second input of a differential amplifier is opened to initiate a reset phase where the sensor electrode and the differential amplifier are decoupled. This is illustrated and described in conjunction with circuits 400, 600, and 700 where switch SW1 is opened to decouple the inverting input of differential amplifier 401 from sensor electrode 270-0.

At procedure 920 of flow diagram 900, in one embodiment, a feedback capacitance is reset to a first level of charge, the feedback capacitance is disposed between the second input and the output of the differential amplifier. The resetting can comprise a reset of all or a portion of the feedback capacitance. This resetting is illustrated and described in conjunction with circuits 400 and 600 where switch SW2 in circuits 400 and 600 is closed to cause capacitive discharge and reset a capacitor ($C_{FB}$ in circuit 400 or $C_{FB0}$ in circuit 600) to a fully discharged state. This resetting is also illustrated and described in conjunction with circuits 600 and 700 and reset phase 1, where switch SW3 in circuits 600 and 700 is positioned to cause pre-charge of a capacitor ($C_{FB}$ in circuit 700 or $C_{FB1}$ in circuit 600) to a selected value.

At procedure 930 of flow diagram 900, in one embodiment, the switch is closed to initiate a measurement phase where the second input and the sensor electrode are coupled. This is illustrated and described in conjunction with circuits 400, 600, and 700 where switch SW1 is closed to couple the inverting input of differential amplifier 401 with sensor electrode 270-0 and to facilitate an integration phase where the background capacitance associated with sensor electrode 270-0 is integrated and thus measured.

Procedure 930 includes procedures 932 and 934. At procedure 932 of flow diagram 900, in one embodiment, the measurement phase comprises balancing charge between the sensor electrode and the feedback capacitance such that a sensor electrode voltage equals a voltage of the first input equals a voltage of the second input, and the sensor electrode is charged to a value proportional to its capacitance and the voltage of the second input.

For example, with reference to circuits 400, 600, and 700, during the reset phase 1 the voltages on the non-inverting input, inverting input, and output of differential amplifier 401 balance and settle to the value of $V_{AbsInput}$ supplied to the non-inverting input. Closing switch SW1 to initiate integration phase 1 (i.e., a measurement phase) causes this balancing to further act to charge sensor electrode 270-0. In the measurement phase, sensor electrode 270-0 is connected to the second input (the inverting input) through switch SW1, and thus charge is transferred from/to the feedback capacitance (of circuits 400, 600, or 700) to/from sensor electrode 270-0. The second input (the inverting input) also settles to the same value as the voltage driven on the first input (the non-inverting input) of differential amplifier 401. The first input (the non-inverting input of differential amplifier 401) is driven with a modulated reference voltage. In this manner, the sensor electrode voltage is equal to the voltage of second input of amplifier 401 which is equal to the voltage applied to the first input of amplifier 401; and sensor electrode 270-0 is thus charged to a value proportional to its capacitance and the voltage of the first and second inputs.

At procedure 934 of flow diagram 900, in one embodiment, the measurement phase also comprises utilizing the differential amplifier to integrate charge on the sensor electrode, such that an absolute capacitance is measured. This absolute capacitance coupling is the sum of coupling between a sensor (e.g., sensor electrode 270-0) and an input object 140 (if present) and a coupling between the sensor (e.g., sensor electrode 270-0) and GND plane. By making multiple measurements in this manner and determining deltas over time by comparison of these measurements, an absolute capacitance corresponding to a coupling between the sensor (e.g., sensor electrode 270-0) and an input object 140 is measured. For example, with reference to circuits 400, 600, and 700, by closing switch SW1, differential amplifier 401 integrates the charge, $C_B$, present on sensor electrode 270-0. $C_B$ includes the background capacitance between the sensor electrode and ground, and if an input object 140 is present in the sensing region associated with sensor electrode 270-0 its capacitance will be part of this background capacitance which is integrated and measured.

In some embodiments, the method as illustrated by procedures 910-930 further comprises procedures 940 and 950.

At procedure 940 of flow diagram 900, in one embodiment, opening the switch after the measurement phase to initiate a second occurrence of the reset phase. For example, as described in conjunction with circuits 400, 600, and 700 sensing is split into two half cycles and each half cycle includes a reset phase. Thus, if 910 describes the reset phase of the first half sensing cycle (e.g., 521 of FIG. 5), then 940 describes opening switch SW1 again to initiate the reset phase of the second half sensing cycle (e.g., 522 of FIG. 5). During this reset phase the level of modulation of $V_{AbsInput}$ may be switched, such as from $V_{ref}+\Delta V_{ref}$ to $V_{ref}-\Delta V_{ref}$.

At procedure 950, in one embodiment, the second reset phase involves resetting the feedback capacitance to a second level of charge, wherein the first and second levels of charge are different. With reference to FIG. 6B and FIG. 7, in one embodiment, this involves pre-charging all or a portion of a feedback capacitance to a different level of charge than during the first reset phase. This is accomplished by positioning of switch SW3. For, example if switch SW3 was coupled with $2V_{ref}$ during the first reset phase it would be coupled with ground during the second reset phase.

In some embodiments, the method as illustrated by procedures 910-930 further comprises procedure 960. At procedure 960 in one embodiment, during a transcapacitive sensing cycle, the differential amplifier is utilized to measure a resulting charge on the sensor electrode. The resulting charge corresponds to a capacitive coupling between the sensor electrode and a second sensor electrode, wherein the second sensor electrode has been driven with a transmitter signal. This is illustrated in FIG. 8 which shows differential amplifier 401 being used to integrate a resulting charge/signal on receiver electrode 270-0, where that resulting charge results from transmitter electrode 260-0 being driven with a transmitter signal by processing system 110.

The examples set forth herein were presented in order to best explain, to describe particular applications, and to thereby enable those skilled in the art to make and use embodiments of the described examples. However, those skilled in the art will recognize that the foregoing description and examples have been presented for the purposes of illustration and example only. The description as set forth is not intended to be exhaustive or to limit the embodiments to the precise form disclosed.

What is claimed is:

1. A capacitance measurement circuit comprising:
   a differential amplifier comprising:
      a first input and a second input, wherein said first input is coupled to a modulated reference voltage and said second input is coupled with a sensor electrode; and
      an output;
   a first feedback capacitance coupled between said output and said second input;
   a second feedback capacitance coupled between said output and said second input;
   a reset mechanism coupled in parallel with said first feedback capacitance and said second feedback capacitance and configured to reset said first feedback capacitance to a first level of charge and to reset said second feedback capacitance to a second level of charge; and
   a switch coupled with said second input, said switch having a closed state and an open state,
   wherein said reset mechanism is configured to reset said first feedback capacitance to said first level of charge when said switch is in the open state,
   wherein during an absolute capacitance measurement phase said differential amplifier is configured to charge said sensor electrode while balancing voltages on said first input and said second input to a voltage level associated with said modulated reference voltage coupled with said first input and to integrate charge on said sensor electrode to measure capacitance corresponding to a coupling between said sensor electrode and an input object.

2. The capacitance measurement circuit of claim 1, wherein said first level of charge and said second level of charge are different.

3. The capacitance measurement circuit of claim 1, wherein said second feedback capacitance is configured to be selectively coupled to a first voltage level, a second voltage level and said output, wherein said first voltage level is greater than said second voltage level.

4. The capacitance measurement circuit of claim 1, wherein during a transcapacitive sensing cycle said differential amplifier is further configured to measure a resulting charge on said sensor electrode corresponding to a capacitive coupling between said sensor electrode and a second sensor electrode.

5. The capacitance measurement circuit of claim 1, wherein said second feedback capacitance acts as a charge subtractor which increases a dynamic range of said differential amplifier.

6. The capacitance measurement circuit of claim 1, wherein said first feedback capacitance corresponds to a first capacitor and said second feedback capacitance corresponds to a second capacitor.

7. The capacitance measurement circuit of claim 1, wherein said first feedback capacitance and said second feedback capacitance are composed of a plurality of selectable capacitors.

8. An input device comprising:
   a sensor electrode; and
   a capacitance measurement circuit comprising:
      a differential amplifier comprising:
         a first input and a second input, wherein said first input is coupled to a modulated reference voltage and said second input is coupled with said sensor electrode;
         an output; and
      a switch coupled with said second input, said switch having a closed state and an open state;
      a first feedback capacitance coupled between said output and said second input;
      a second feedback capacitance coupled between said output and said second input; and
      a reset mechanism coupled in parallel with said first feedback capacitance and said second feedback capacitance and configured to reset said first feedback capacitance to a first level of charge and to reset said second feedback capacitance to a second level of charge during a reset phase,
   wherein said reset mechanism is configured to reset said first feedback capacitance to said first level of charge when said switch is in the open state, and
   wherein during an absolute capacitance measurement phase said differential amplifier is configured to charge said sensor electrode while balancing voltages on said first input and said second input to a voltage level associated with said modulated reference voltage coupled with said first input and to integrate charge on said sensor electrode to measure capacitance corresponding to a coupling between said sensor electrode and an input object.

9. The input device of claim 8 further comprising a second sensor electrode, and wherein said differential amplifier is further configured, during a transcapacitive sensing cycle, to measure a resulting charge on said sensor electrode corresponding to a capacitive coupling between said sensor electrode and said second sensor electrode.

10. The input device of claim 9, wherein time lengths of said reset phase and a transcapacitive reset phase of said transcapacitive sensing cycle are substantially equal.

11. The input device of claim 8, wherein said reset phase is shorter than said absolute capacitance measurement phase.

12. The input device of claim 8, wherein said first level of charge and said second level of charge are different.

13. The input device of claim 8, wherein said second feedback capacitance is configured to be selectively coupled to a first voltage level, a second voltage level and said output, wherein said first voltage level is greater than said second voltage level.

14. The input device of claim 8, wherein said second feedback capacitance acts as a charge subtractor which increases a dynamic range of said differential amplifier.

15. The input device of claim 8, wherein said first feedback capacitance corresponds to a first capacitor and said second feedback capacitance corresponds to a second capacitor.

16. The input device of claim 8, wherein said first feedback capacitance and said second feedback capacitance are composed of a plurality of selectable capacitors.

17. A method of capacitive measurement with a differential amplifier having an output, a first input, and a second input, said method comprising:
   during an absolute sensing cycle:
      resetting, using a reset mechanism in a capacitance measurement circuit, a first feedback capacitance to a first level of charge and a second feedback capacitance to a second level of charge, wherein said first feedback capacitance and said second feedback capacitance are disposed between said second input and said output,
      wherein said reset mechanism is coupled in parallel with said first feedback capacitance and said second feedback capacitance,
      wherein said second input is coupled with a switch having a closed state and an open state, and wherein said reset mechanism is configured to reset said first feedback capacitance to said first level of charge when said switch is in the open state;

balancing charge between a sensor electrode and said first feedback capacitance and said second feedback capacitance such that a voltage of said sensor electrode equals a voltage of said first input and a voltage of said second input, and said sensor electrode is charged to a value proportional to its capacitance and said voltage of said second input; and utilizing said differential amplifier to integrate charge on said sensor electrode, such that an absolute capacitance is measured.

18. The method as recited in claim 17, wherein said second feedback capacitance is configured to be selectively coupled to a first voltage level, a second voltage level and said output, wherein said first voltage level is greater than said second voltage level.

* * * * *